United States Patent
Akram et al.

[11] Patent Number: 5,949,241
[45] Date of Patent: Sep. 7, 1999

[54] METHOD FOR TESTING INTERCONNECTS AND SEMICONDUCTOR DICE

[75] Inventors: Salman Akram, Boise; Warren M. Farnworth, Nampa, both of Id.

[73] Assignee: Micron Technology, Inc., Boise, Id.

[21] Appl. No.: 08/889,535

[22] Filed: Jul. 8, 1997

Related U.S. Application Data

[62] Division of application No. 08/604,007, Feb. 20, 1996, Pat. No. 5,742,169.

[51] Int. Cl.$^6$ .................................................... G01R 31/02
[52] U.S. Cl. ............................................ 324/755; 324/765
[58] Field of Search ..................................... 324/765, 755, 324/158.1, 763; 438/14, 17; 257/40, 48; 371/15.1

[56] References Cited

U.S. PATENT DOCUMENTS

| | | | |
|---|---|---|---|
| 4,450,515 | 5/1984 | Takemae et al. | 363/60 |
| 4,853,628 | 8/1989 | Gouldsberry | 324/158 R |
| 4,918,385 | 4/1990 | Shreeve | 324/158 R |
| 5,006,792 | 4/1991 | Malhi et al. | 324/158 F |
| 5,030,904 | 7/1991 | Figal | 324/158 R |
| 5,047,711 | 9/1991 | Smith et al. | 324/158 R |
| 5,073,117 | 12/1991 | Malhi et al. | 439/71 |
| 5,088,190 | 2/1992 | Malhi et al. | 29/843 |
| 5,123,850 | 6/1992 | Elder et al. | 439/67 |
| 5,225,037 | 7/1993 | Elder et al. | 156/644 |
| 5,302,891 | 4/1994 | Wood et al. | 324/158 F |
| 5,367,253 | 11/1994 | Wood et al. | 324/158.1 |
| 5,397,245 | 3/1995 | Roebuck et al. | 439/264 |
| 5,408,190 | 4/1995 | Wood et al. | 324/765 |
| 5,419,807 | 5/1995 | Akram et al. | 156/647.1 |
| 5,424,652 | 6/1995 | Hembree et al. | 324/755 |
| 5,451,165 | 9/1995 | Cearley-Cabbiness et al. | 439/71 |
| 5,453,701 | 9/1995 | Jensen et al. | 324/755 |
| 5,456,404 | 10/1995 | Robinette, Jr. et al. | 228/104 |
| 5,489,851 | 2/1996 | Heumann et al. | 324/760 |
| 5,519,332 | 5/1996 | Wood et al. | 324/755 |
| 5,543,725 | 8/1996 | Lim et al. | 324/755 |
| 5,572,140 | 11/1996 | Lim et al. | 324/755 |
| 5,634,267 | 6/1997 | Farnworth et al. | 29/840 |
| 5,721,496 | 2/1998 | Farnworth et al. | 324/765 |
| 5,742,169 | 4/1998 | Akram et al. | 324/755 |
| 5,783,461 | 7/1998 | Hembree | 438/17 |
| 5,815,000 | 9/1998 | Farnworth et al. | 324/755 |

OTHER PUBLICATIONS

Cloud et al., "Equipment, Processes and Method for High Volume KGD Production", Semicon West 1994, Mountview, CA., Third Annual Manufacturing, Jul. 2, 1994.

*Primary Examiner*—Vinh P. Nguyen
*Attorney, Agent, or Firm*—Stephen A. Gratton

[57] ABSTRACT

A method for testing an interconnect for a bare semiconductor die is provided. The method includes: assembling the interconnect and die in a temporary package; applying a bias voltage between a conductor and a substrate of the interconnect; and then detecting leakage current from the conductor to the substrate or to another conductor. A current sensing circuit makes an electrical connection with each conductor and with the substrate for the interconnect. The current sensing circuit then applies a bias voltage to the conductors and detects any resultant leakage current. The electrical connection with the substrate can be with a spring loaded connector operating through a hole in a base of the temporary package, or with a conductive member formed on the temporary package in electrical communication with a dedicated external lead.

20 Claims, 5 Drawing Sheets

```
┌─────────────────────────────────────────────┐
│         PROVIDING A TEMPORARY               │
│ PACKAGE FOR A BARE DIE INCLUDING AN         │
│ INTERCONNECT FOR MAKING A TEMPORARY         │
│   ELECTRICAL CONNECTION WITH THE DIE        │
└─────────────────────────────────────────────┘
                      │
┌─────────────────────────────────────────────┐
│  ASSEMBLING THE DIE AND INTERCONNECT        │
│       IN THE TEMPORARY PACKAGE              │
└─────────────────────────────────────────────┘
                      │
┌─────────────────────────────────────────────┐
│   ELECTRICALLY CONNECTING A CURRENT         │
│ SENSING CIRCUIT TO CONDUCTORS ON THE        │
│ INTERCONNECT AND TO A SUBSTRATE OF          │
│            THE INTERCONNECT                 │
└─────────────────────────────────────────────┘
                      │
┌─────────────────────────────────────────────┐
│   APPLYING A BIAS VOLTAGE TO EACH           │
│ CONDUCTOR AND MEASURING A RESULTANT         │
│ CURRENT FLOW THROUGH THE SUBSTRATE          │
│         OR ANOTHER CONDUCTOR                │
└─────────────────────────────────────────────┘
```

FIGURE 1

METHOD FOR TESTING INTERCONNECTS AND SEMICONDUCTOR DICE

CROSS REFERENCE TO RELATED APPLICATIONS

This application is a division of application Ser. No. 08/604,007 filed Feb. 20, 1996, U.S. Pat. No. 5,742,169.

FIELD OF THE INVENTION

This invention relates to semiconductor manufacture and specifically to a method and apparatus for testing interconnects used for testing bare semiconductor dice.

BACKGROUND OF THE INVENTION

Unpackaged or bare semiconductor dice are used to construct multi chip modules and other electronic devices. Unpackaged dice must be tested and burned in during the manufacturing process to certify each die as a known good die. This has led to the development of temporary packages that hold a single bare die for testing and burn-in. The temporary packages provide the electrical interconnection between the bond pads on the die and external test circuitry. Exemplary temporary packages are disclosed in U.S. Pat. Nos. 5,302,891; 5,408,190 and 5,495,179 to Wood et al., which are incorporated herein by reference.

Typically, this type of temporary package includes an interconnect having contact members that make a temporary electrical connection with the bond pads on the die. The temporary package can also include a force applying mechanism that presses the die against the interconnect. For example, in the above cited patents the force applying mechanism can include a clamp mechanism that attaches to a package base, and a spring that presses the die against the interconnect.

Typically, the interconnect for the temporary package includes a substrate wherein the contact members are formed. One type of interconnect is formed of silicon and includes raised contact members formed as etched pillars having penetrating projections. The penetrating projections are adapted to penetrate into the bond pads on the die to form a temporary electrical connection for testing. A conductive layer overlies each raised contact member and is in contact with a conductor (e.g., metal traces) formed on the substrate. The conductors can be wire bonded, or otherwise electrically connected, to corresponding external contacts on the base of the temporary package. This type of interconnect is described in U.S. Pat. No. 5,483,741 to Akram et al., which is incorporated herein by reference.

Another type of interconnect includes a substrate and microbump contact members mounted on the substrate. The substrate in this case can be silicon, or a low CTE material such as ceramic or glass. The microbump contact members and conductors can be in the form of a flexible tape similar to two layer TAB tape. This type of interconnect is described in U.S. Pat. No. 5,487,999 to Farnworth, which is incorporated herein by reference.

Both of these types of interconnects can include electrical or structural defects which can cause the die test procedure to be affected or invalidated. For example, an insulating layer that insulates the conductors of the interconnect from the substrate can be defective and allow current to leak from one or more conductors into the substrate. The substrate can also include cracks that propagate through the insulating layer creating undesirable electrical paths in the assembled temporary package.

This type of defect can be present as a result of the fabrication process for the interconnect. Also, since the interconnects are designed to be reused many times, defects can arise as a result of continued usage of an interconnect and package. For example, the interconnects and packages are repeatedly stressed by the force applying mechanism which biases the die and interconnect together. In addition, the interconnects and packages are repeatedly subjected to thermal cycling in a burn-in oven.

In view of the foregoing, it would be desirable to have a method for checking the electrical and structural integrity of interconnects for temporary packages used to test bare semiconductor dice. Furthermore, it would be desirable for a temporary package to be constructed to allow testing of the interconnect component in the assembled package.

Accordingly, it is an object of the present invention to provide a method for testing an interconnect for a bare semiconductor die. It is another object of the present invention to provide a method for testing the interconnect that can be performed in an assembled temporary package. It is yet another object of the present invention to provide a temporary package for testing the bare die that is constructed to allow testing of die and the interconnect component. Other objects, advantages and capabilities of the present invention will become more apparent as the description proceeds.

SUMMARY OF THE INVENTION

In accordance with the present invention, a method for testing an interconnect for a bare semiconductor die, and a temporary package that allows the method to be performed, are provided. The interconnect includes a substrate, and raised contact members in electrical communication with conductors formed on the substrate. In the assembled temporary package, the die and interconnect are biased together with the raised contact members on the interconnect in contact with the bond pads of the die. An exemplary interconnect includes etched contact members formed on a silicon substrate. Another exemplary interconnect includes microbump contact members attached to a film and mounted to the substrate.

The temporary package includes a base for retaining the die and interconnect, and a force applying mechanism for biasing the die and interconnect together. In addition, the temporary package includes external leads, which in the assembled package, are in electrical communication with the conductors on the interconnect.

For detecting leakage current from the conductors to the substrate of the interconnect, each external lead on the package base corresponding to the conductors, is electrically connected to a current sensing circuit. At the same time, the substrate of the interconnect is electrically connected to the current sensing circuit. The current sensing circuit is adapted to apply a voltage to each conductor separately and to measure any resultant leakage current. The leakage current can be through the substrate or through another conductor.

For forming a circuit path from the current sensing circuit to the substrate, a temporary electrical connector, such as a spring loaded pin, can be operated through an opening in the package base to contact a backside of the substrate. Alternately, a dedicated external lead on the package base can be in electrical contact with a conductive member formed on the package base and adapted to contact an edge of the substrate.

BRIEF DESCRIPTION OF THE DRAWINGS

FIG. 1 is a flow diagram of broad steps in the method of the invention;

DETAILED DESCRIPTION OF THE PREFERRED EMBODIMENT

Referring to FIG. 1, steps in the method of the invention are illustrated. The method, simply stated, includes the steps of:

A. Providing a temporary package for a bare die including an interconnect for making a temporary electrical connection with the die.

B. Assembling the die and interconnect in the temporary package.

C. Electrically connecting a current sensing circuit to conductors on the interconnect and to a substrate of the interconnect.

D. Applying a bias voltage to each conductor and measuring a resultant current flow through the substrate or through another conductor.

Figure 2:
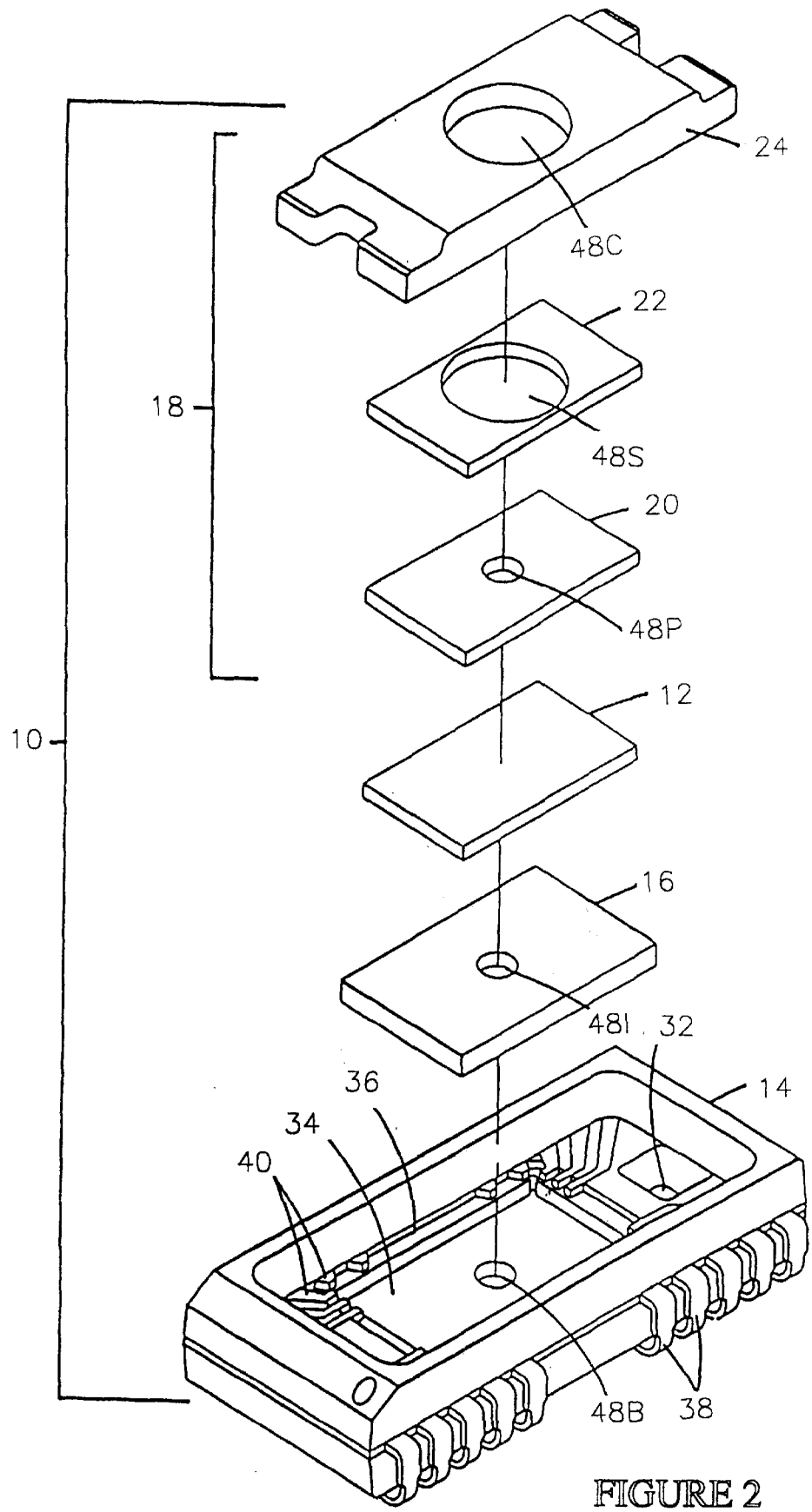
FIG. 2 is an exploded perspective view of a temporary package constructed in accordance with the invention.

A temporary package 10 for performing the method of the invention is shown in FIG. 2. The temporary package 10 includes a package base 14, an interconnect 16, and a force applying mechanism 18. The interconnect 16 establishes electrical communication between the package base 14 and the die 12. The force applying mechanism 18 secures the die 12 to the package base 14 and presses the die 12 against the interconnect 16. The force applying mechanism 18 includes a pressure plate 20, a spring 22 and a cover 24. The package 10 also includes a latching mechanism in the form of clips 26, 28 (FIG. 2A) which secure the force applying mechanism 18 to the package base 14.

In the illustrative embodiment, the package 10 has an outline that is substantially equivalent to the outline of a conventional semiconductor package. Further details of the temporary package 10 are disclosed in U.S. patent application Ser. No. 08/580,687, U.S. Pat. No. 5,815,000 incorporated herein by reference.

Figure 2A:
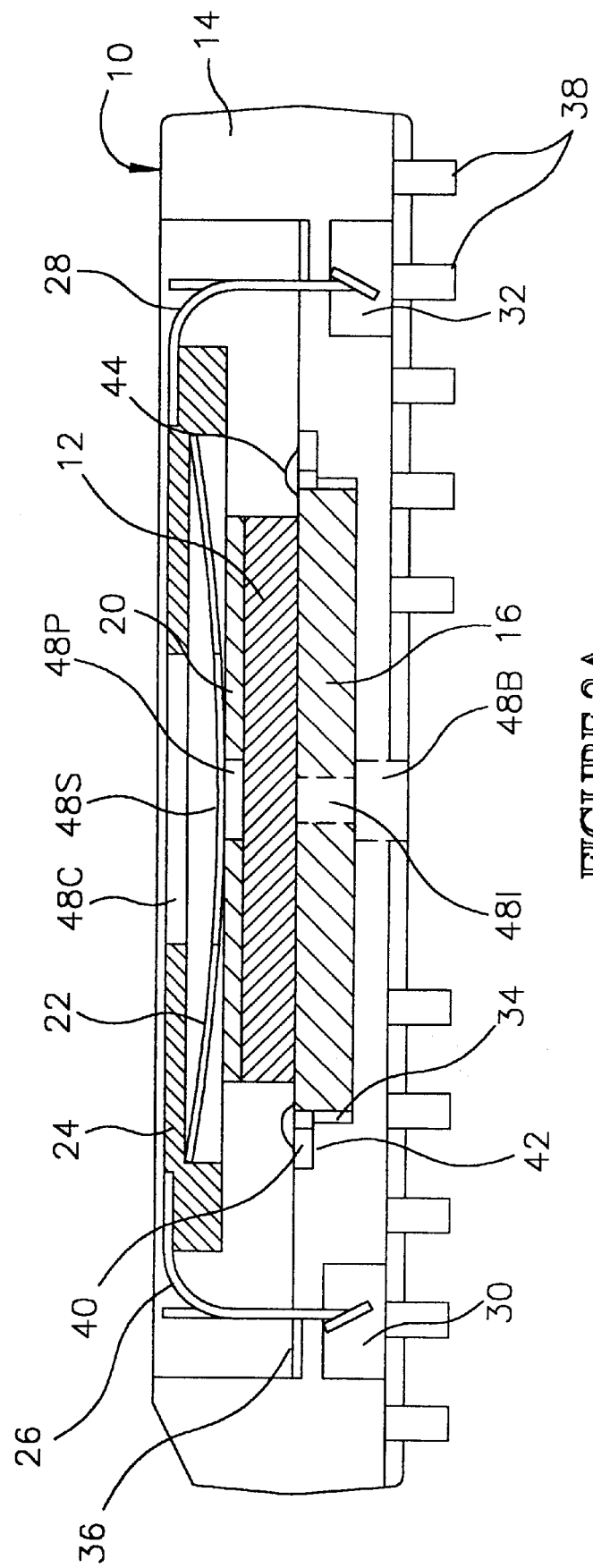
FIG. 2A is a cross sectional view of the assembled temporary package.

As shown in FIG. 2A, in the assembled package 10, the die 12 is held within a recess 36 formed within the package base 14 and is sandwiched between the interconnect 16 and the cover 24. The interconnect 16 is also mounted within a recess 34 formed within the package base 14. As also shown in FIG. 2A, in the assembled package 10, the pressure plate 20 overlies the die 12, and the spring 22 presses the pressure plate 20 and the die 12 against the interconnect 16.

Still referring to FIG. 2A, the clips 26, 28 attach to corresponding openings 30, 32 in the base 14 to secure the cover 24, spring 22 and pressure plate 20 of the force applying mechanism 18 and the die 12 within the package base 14. The clips 26, 28 can be formed of a flexible material such as spring steel, or plastic, and are shaped to exert a retention force on the cover 24. Furthermore, in the assembled package 10, the cover 24 is recessed below the top surface of the package base 14. The outer peripheral size and outline of the package 10 are thus substantially determined by the outer peripheral size and outline of the package base 14.

The cover 24, spring 22 and pressure plate 20 all include a central opening which are designated 48C, 48S and 48P respectively. The openings 48C, 48S and 48P are used during assembly of the package 10 to permit the die 12 to be held by a vacuum tool (not shown) during optical alignment of the die 12 and interconnect 16. In a similar manner, a vacuum tool (not shown) can be used to disassemble the package 10.

Figure 2C:
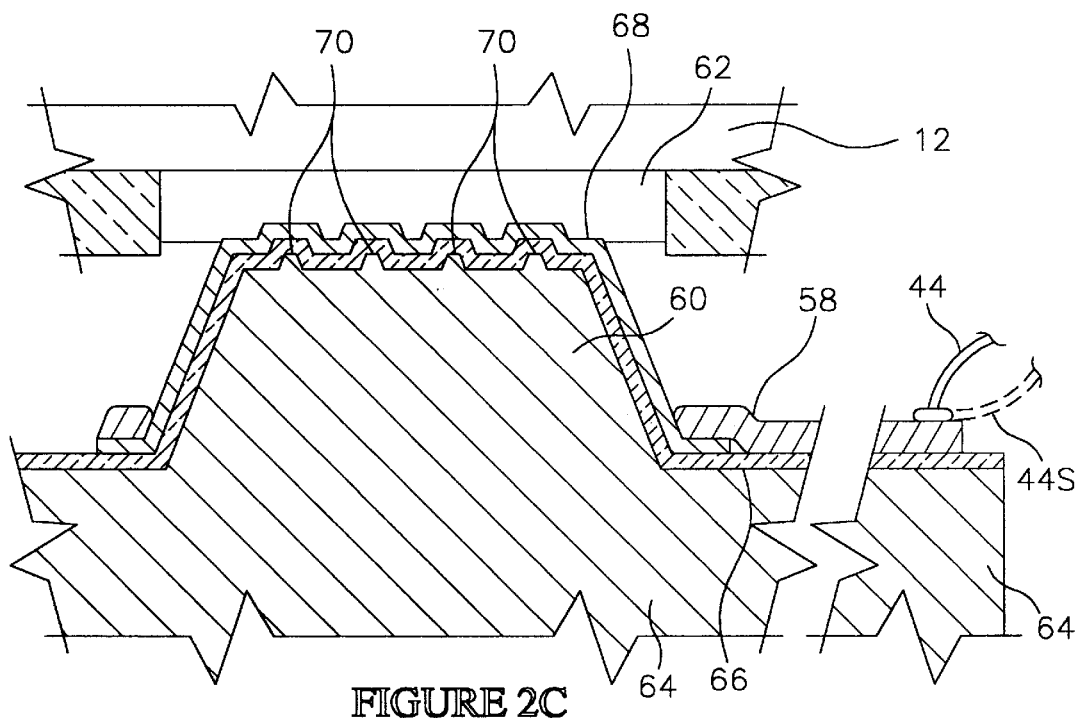
FIG. 2C is a cross sectional view taken along section line 2C—2C of FIG. 2B.
Figure 3:
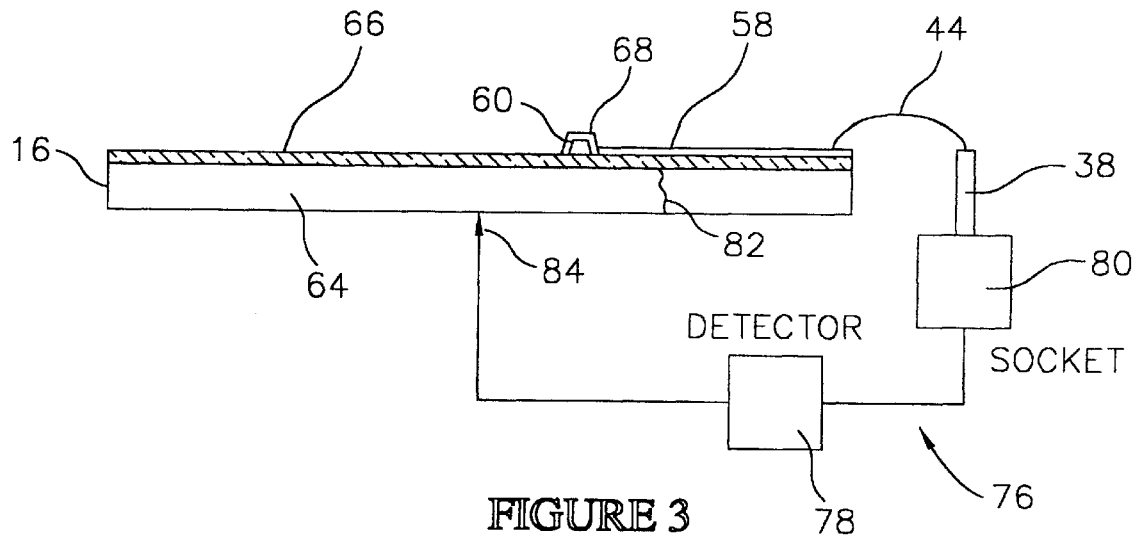
FIG. 3 is a schematic diagram of an electrical circuit for testing the interconnect in accordance with the invention.

In addition, an opening 48B can be provided through the package base 14 and an opening 48I can be provided through the interconnect 16. The openings 48B and 48I permit a vacuum to be directed at the die 12 to allow retaining the die 12 in place during assembly of the temporary package 10. In addition, the opening 48B allows access through the package base 14 to the substrate 64 (FIG. 2C) of the interconnect 16 for leak checking circuitry 76 (FIG. 3).

As also shown in FIG. 2A, the interconnect 16 for the package 10 can be wire bonded to conductive traces 40 on the package base 14 and to bonding sites 56 (FIG. 2B) on the interconnect 16 using bond wires 44.

Figure 2B:
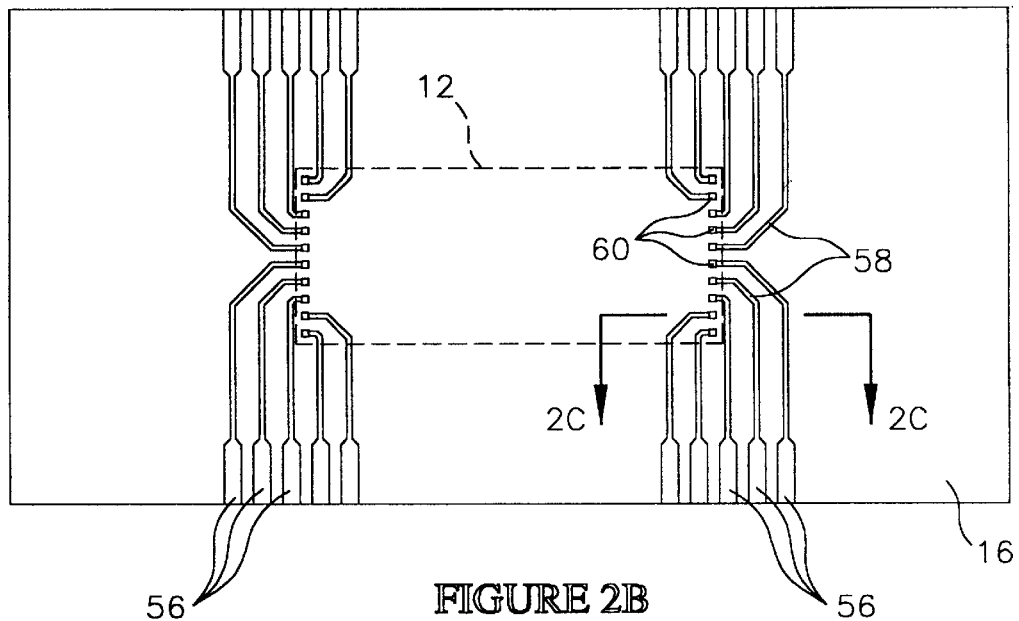
FIG. 2B is a plan view of an exemplary interconnect for the temporary package.

Referring to FIG. 2B, the interconnect 16 is shown separately. As shown in FIG. 2B, the interconnect 16 includes conductors 58 and raised contact members 60. As shown in FIG. 2C, the raised contact members 60 are adapted to contact and establish an electrical connection with the pads 62 on the die 12. In addition, the raised contact members 60 can include penetrating projections 70 formed as elongated blades adapted to penetrate the pads 62 on the die 12 to a self limiting penetration depth.

The interconnect 16 and raised contact members 60 can be formed by etching a silicon substrate 64. An insulating layer 66 and a conductive layer 68 are formed on the substrate 64 atop the raised contact members 60. In the assembled package 10, the conductive layer 68 is in electrical communication with the conductors 58 and bonding sites 56 which are wire bonded to bond wires 44. Alternately, in place of wire bonding in the assembled package 10, an electrical connection can be formed to the conductors 58 with slide contacts 44S.

A suitable process for forming the interconnect 16, substantially as shown in FIGS. 2B and 2C, is disclosed in U.S. Pat. Nos. 5,326,428; 5,419,807 and 5,483,741 which are incorporated herein by reference.

Figure 2D:
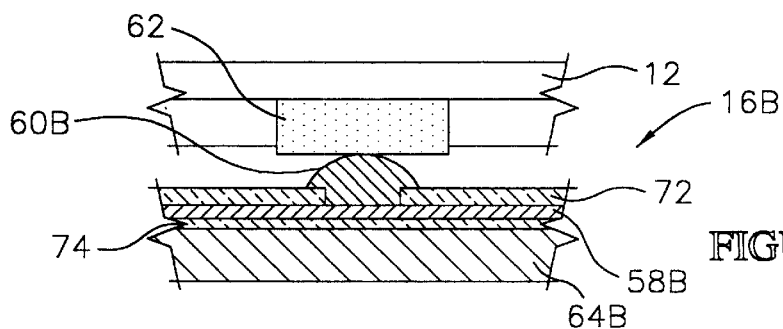
FIG. 2D is cross sectional view equivalent to FIG. 2C of another exemplary interconnect.

Referring to FIG. 2D, an alternate embodiment interconnect 16B is shown. The interconnect 16B includes microbump contact members 60B and conductors 58B formed on a plastic film 72. The microbump contact members 60B and plastic film 72 can be similar to two layer TAB tape such as ASMAT manufactured by Nitto Denko. The plastic film 72 can be mounted to a substrate 64B such as silicon using a compliant adhesive layer 74. The compliant adhesive layer 74 in addition to providing compliancy for the microbumps 60B, also insulates the conductors 58B from the substrate 64B. The compliant adhesive layer 74 can be formed of a silicone elastomer, an epoxy or a polyimide material. The substrate 64B can also include an insulating layer (not shown) equivalent to the insulating layer 66 (FIG. 2B) previously described. One method for forming an interconnect with microbump contact members is described in U.S. Pat. No. 5,519,332.

Referring again to FIG. 2, the package 10 can be assembled using optical alignment techniques and an automated assembly apparatus. U.S. patent application Ser. No. 08/338,345 filed Nov. 14, 1994, now U.S. Pat. No. 5,634,267, incorporated herein by reference, describes an automated apparatus suitable for optically aligning the die 12 and interconnect 16 and securing the force applying mechanism 18 to the package base 14.

The assembly apparatus includes an assembly tool (not shown) that is adapted to retain the force applying mechanism 18 (FIG. 2), die 12 and clips 26, 28 (FIG. 2A). The components of the force applying mechanism 18 include the openings 48C, 48S, 48P which allow a vacuum wand (not shown) of the assembly tool to hold the die 12. With the die 12 held by the assembly tool, the bond pads 62 (FIG. 2C) on the die 12 are aligned with the contact members 60 (FIG. 2C) on the interconnect 16. The assembly tool then places the die 12 in contact with the interconnect 16 and secures the clips 26, 28 (FIG. 2A) to the openings 30, 32 in the package base 14. A vacuum directed through openings 48I and 48B (FIG. 2A) can be used to hold the die 12 in place during attachment of the force applying mechanism 18.

One problem in the assembled package 10 can occur if the insulating layer 66 (FIG. 2C) for the interconnect 16 (FIG. 2B) has a crack or defect. In this case, an undesirable conductive path can exist between a conductor 58 (FIG. 2B) and the substrate 64 (FIG. 2C) or between two or more conductors 58. These undesirable conductive paths can cause the testing procedure for the die 12 to be inaccurate. A similar situation exists for the interconnect 16B (FIG. 2D) if the adhesive layer 74 (FIG. 2D) or other insulator formed on the substrate 64B has a crack or defect.

This problem can be caused by the substrate 64 forming a crack 82 (FIG. 3) during use and then causing the insulating layer 66 (FIG. 2C) to crack. Since the temporary package 10 is designed to be used many times, the substrate 64 for the interconnect 16 is repeatedly stressed by the force applying mechanism 18 and by temperature cycling during the test procedure. Accordingly, the probability of a crack 82 occurring is high.

The method of the invention checks the interconnect 16 for this type of defect by performing a "leak check". The leak check can be performed in the assembled package 10 at the same time that the die 12 is tested. In order to test the interconnect 16 for leaks during a die test procedure, the temporary package 10 can be constructed for use with a current sensing circuit 76 (FIG. 3). The current sensing circuit 76 is adapted to test the interconnect 16 in the assembled temporary package 10.

As shown schematically in FIG. 3, the current sensing circuit 76 is placed in electrical communication with the conductors 58 on the interconnect 16 and with the substrate 64 for the interconnect 16. Advantageously, the current sensing circuit 76 can be part of the test circuitry for testing the die 12. For example, the current sensing circuit 76 can be electrically connected to a burn-in board for the assembled package 10.

The current sensing circuit 76 is adapted to apply a voltage between each conductor 58 on the interconnect 16 and the substrate 64 and to detect any resultant current. In a similar manner leakage current between the conductors 58 can be detected by the current sensing circuit 76. The current sensing circuit 76 includes a current detector 78 and a contact member 84. The current detector 78 can be similar in construction to circuits that are used in the art for leak checking the pads on a semiconductor die. For example, the current detector 78 can include a current source and current measuring devices such as ammeters. The current detector 78 can be constructed using known methods to detect currents as small as pico amps (10–12 amps) in magnitude.

The current detector 78 is in electrical communication with an electrical socket 80 and with the contact member 84. The electrical socket 80 can be part of a burn-in board for the temporary package 10. The electrical socket 80 includes electrical connectors that electrically contact the output contacts 38 in the assembled package 10. The socket 80 thus provides a circuit path from the current detector 78 to each conductor 58 on the interconnect 16. The contact member 84 is adapted to provide a circuit path from the current detector 78 to the substrate 64 for the interconnect 16.

Figure 4A:
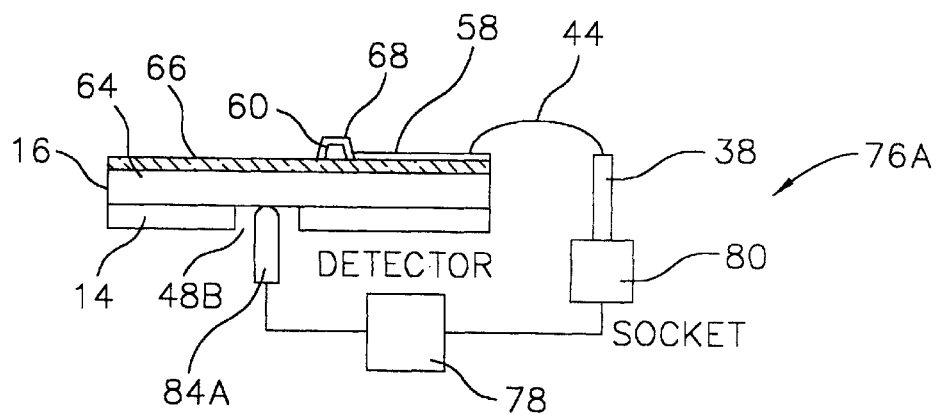
FIG. 4A is a schematic diagram of an electrical circuit for testing the interconnect using an electrical connector for contacting a back side of the interconnect.
Figure 4B:
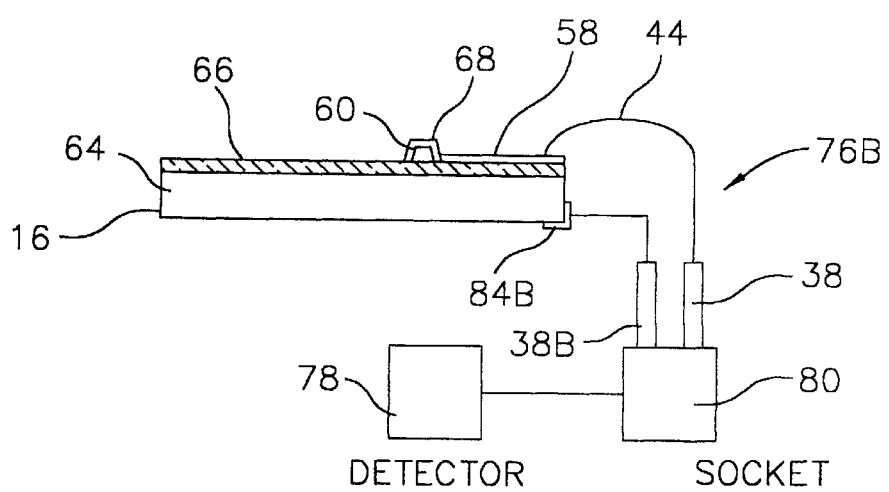
FIG. 4B is a schematic diagram of an electrical circuit for testing the interconnect using an electrical connector formed on the temporary package for contacting the back side and sidewall of the interconnect.

Two different embodiments for the contact member 84 are shown in FIGS. 4A and 4B. In FIG. 4A, current sensing circuit 76A includes a spring loaded electrical connector 84A designed to press against the back side of the substrate 64 for the interconnect 16. In this case, the electrical connector 84A can access the interconnect 16 through the opening 48B in the package base 14 (FIG. 2A). As is apparent, the spring loaded electrical connector 84A can be formed in a variety of configurations. One suitable configuration is known as a "pogo pin" connector. This type of electrical connector includes a spring loaded pin adapted to contact and press against a flat surface to form an electrical connection. Pogo pin connectors are manufactured by Pogo Instruments, Inc., Kansas City, Kans.

In the current sensing circuit 76A of FIG. 4A, the electrical path from the current detector 78 to the substrate 64 is through the electrical connector 84A. In addition, the electrical path from the current detector 78 to the conductors 58 on the interconnect 16, is through the socket 80 on the burn-in board, through the external leads 38 of the package 10 and through the bond wires 44 of the package 10. As is apparent, this arrangement allows a bias voltage to be applied by the current detector 78 to each conductor 58 separately, and for any resultant current through the substrate 64 to the electrical connector 84A to be detected. In a similar manner any resultant current between the conductors 58 can be detected. This resultant current can be indicative of a cracked substrate 64 and a defective insulating layer 66 (FIG. 2C) on the interconnect 16.

In FIG. 4B, the current sensing circuit 76B includes an electrical connector 84B formed as a conductive member on the package base 14. The electrical connector 84B can be formed as a metal pad or malleable metal contact deposited and shaped using a suitable deposition process such as CVD, electrodeposition, plating or stencil mask deposition. The electrical connector 84B can be similar in construction to the conductive traces 40 (FIG. 2A) formed on the package base 14 (FIG. 2) but with a location and shape for contacting an exposed portion of the substrate 64 for the interconnect 16. For example, the electrical connector 84B can be located and shaped on the package base 14 to engage a corner or sidewall of the substrate 64 to establish an electrical connection therewith.

Furthermore, the electrical connector 84B can be in electrical communication with a dedicated external lead 38B formed on the package base 14. The external lead 38B can be formed in a manner similar to the external leads 38 (FIG. 2) for the package 10 and is adapted to make an electrical connection with the socket 80 on the burn-in board. During the test procedure the conductive path from the current detector 78 to the substrate 64 is through the socket 80, through the external lead 38B, and through the electrical connector 84B. The conductive path from the current detector 78 to the conductors 58 for the interconnect 16 is through the external leads 38 on the package base 14 (FIG. 2), and through the bond wires 44.

With either of the current sensing circuits 76A (FIG. 4A) or 76B (FIG. 4B), a bias voltage can be applied by the current detector 78 to each of the external leads 38 on the package base 14. This can be done one lead at a time or simultaneously. Any resultant current to the substrate 64 for the interconnect 16 or between the conductors 58 can then be detected. Advantageously, this test is performed with the interconnect 16 under stress and pressed against the die 12 by the force applying mechanism 18 (FIG. 2). In addition, the test procedure for the interconnect 16 can be performed at the same time that the die 12 is tested.

While the invention has been described with reference to certain preferred embodiments, as will be apparent to those skilled in the art, certain changes and modifications can be made without departing from the scope of the invention as defined by the following claims.

What is claimed is:

1. A method for testing an interconnect for a semiconductor die comprising:

providing the interconnect with a substrate, with a first contact on the substrate, and with a conductor on the substrate for providing an electrical path to the first contact;

providing a temporary package for testing the die comprising an external lead, the interconnect configured for assembly in the package for establishing temporary electrical communication with the die;

assembling the die and the interconnect in the temporary package with the first contact electrically engaging a second contact on the die with the first contact in electrical communication with the conductor and with the external lead;

applying a voltage between the conductor and the substrate and detecting a resultant current flow therebetween.

2. The method of claim 1 wherein the applying step comprises placing a current sensing circuit in electrical communication with the conductor and with the substrate.

3. The method of claim 2 wherein the current sensing circuit comprises an electrical connector configured to electrically contact the substrate.

4. The method of claim 2 wherein the current sensing circuit comprises a spring loaded pin placed through an opening in the temporary package.

5. The method of claim 2 wherein the current sensing circuit comprises a conductive member formed on the temporary package in contact with the substrate.

6. A method for testing an interconnect for a semiconductor die, the interconnect comprising a substrate, a plurality of first contacts on the substrate for electrically engaging second contacts on the die, and a plurality of conductors on the substrate providing electrical paths to the first contacts, said method comprising:

providing a temporary package for testing the die, the package comprising a base with an opening therethrough and a plurality of external leads thereon, the interconnect configured for assembly in the package for establishing temporary electrical communication with the die;

assembling the die and the interconnect in the temporary package with the first contacts electrically engaging the second contacts and with the conductors in electrical communication with the external leads;

providing a current sensing circuit comprising a socket placed in electrical communication with the external leads and an electrical connector placed through the opening into electrical communication with the substrate; and detecting a leakage current between the substrate and the conductors using the circuit.

7. A method for testing an interconnect for a semiconductor die comprising:

providing a temporary package for testing the die, the package comprising a plurality of external leads and an electrical connector;

configuring the interconnect for assembly in the package to establish electrical communication with the die, the interconnect comprising a substrate, a first contact for electrically engaging a second contact on the die, and a conductor in electrical communication with the first contact;

assembling the die and the interconnect in the package, with the first contact in electrical contact with the second contact, with the conductor in electrical communication with an external lead, and with the electrical connector and the substrate in electrical contact;

detecting a leakage current between the electrical connector and the external lead.

8. The method of claim 7 wherein the detecting step comprises placing a current sensing circuit in electrical communication with the external lead.

9. The method of claim 7 wherein the temporary package further comprises a force applying mechanism for biasing the die and the interconnect together, and the detecting step is performed with the die and interconnect biased together.

10. The method of claim 7 wherein the electrical connector comprises a conductive pad on the package configured to contact the substrate.

11. The method of claim 8 wherein the substrate comprises silicon.

12. A method for testing an interconnect for a semiconductor die comprising:

providing a temporary package for the die, the interconnect configured for assembly in the package for establishing temporary electrical communication with the die;

assembling the die and the interconnect in the package, with a conductor on the interconnect in electrical communication with an external lead on the package;

forming a first electrical connection between the external lead and a current sensing circuit;

forming a second electrical connection between the current sensing circuit and a substrate of the interconnect;

detecting a current between the first electrical connection and the second electrical connection using the circuit.

13. The method of claim 12 wherein the second electrical connection comprises a pin contacting the substrate.

14. The method of claim 12 wherein the package comprises an opening for forming the second electrical connection.

15. The method of claim 12 wherein the package comprises an opening for a spring loaded pin for forming the second electrical connection.

16. The method of claim 12 wherein the second electrical connection comprises a conductive member on the temporary package in electrical contact with the substrate.

17. The method of claim 12 wherein the second electrical connection comprises a conductive pad formed on the substrate in electrical communication with a second external lead on the temporary package.

18. A method for testing a semiconductor die comprising:

providing a temporary package for containing the die, the package comprising a base with a plurality of external leads and an interconnect comprising a first contact configured to electrically engage a second contact on the die and a conductor in electrical communication with the first contact and with an external lead;

providing a current sensing circuit configured to detect a leakage current through the first contact or the conductor to the substrate;

placing the current sensing circuit in electrical communication with the first contact or the conductor and with the substrate;

detecting the leakage current while the die is contained in the package with the force applying mechanism attached to the base; and applying test signals through the external leads to the die.

19. The method of claim 18 wherein the current sensing circuit comprises a pin configured to electrically contact the substrate through an opening in the base.

20. The method of claim 18 wherein the base comprises a contact pad configured to electrically contact the substrate, the contact pad in electrical communication with a dedicated external lead on the base configured for electrical communication with the current sensing circuit.

* * * * *